(12) United States Patent
Chen et al.

(10) Patent No.: US 12,449,209 B2
(45) Date of Patent: Oct. 21, 2025

(54) HEAT DISSIPATION STRUCTURE

(71) Applicant: ASIA VITAL COMPONENTS (SHEN ZHEN) CO., LTD., Shenzhen (CN)

(72) Inventors: Dan-Jun Chen, Shenzhen (CN); Guo-Hui Li, Shenzhen (CN); Jun Wang, Shenzhen (CN)

(73) Assignee: ASIA VITAL COMPONENTS (SHEN ZHEN) CO., LTD., Shenzhen (CN)

( * ) Notice: Subject to any disclaimer, the term of this patent is extended or adjusted under 35 U.S.C. 154(b) by 271 days.

(21) Appl. No.: 18/234,853

(22) Filed: Aug. 16, 2023

(65) Prior Publication Data

US 2025/0060170 A1 Feb. 20, 2025

(51) Int. Cl.
*F28D 15/02* (2006.01)
*F28F 9/26* (2006.01)

(52) U.S. Cl.
CPC ..... *F28D 15/0275* (2013.01); *F28D 15/0266* (2013.01); *F28F 9/26* (2013.01); *F28F 2275/02* (2013.01)

(58) Field of Classification Search
CPC .... F28D 15/0275; F28D 15/0266; F28F 9/26; F28F 2275/02
USPC .......................................................... 165/47
See application file for complete search history.

(56) References Cited

U.S. PATENT DOCUMENTS

| | | | |
|---|---|---|---|
| 9,429,369 B2 * | 8/2016 | Wu | H01L 23/427 |
| 9,976,813 B2 * | 5/2018 | Yu | F28D 15/0275 |
| 10,057,552 B2 * | 8/2018 | Okuno | G02B 7/1815 |
| 10,074,591 B1 | 9/2018 | Kulkarni et al. | |
| 10,108,237 B1 * | 10/2018 | Fu | F28D 15/0275 |
| 10,247,488 B2 * | 4/2019 | Lin | H01L 21/4882 |
| 12,215,934 B2 * | 2/2025 | Lin | F28F 21/089 |

(Continued)

FOREIGN PATENT DOCUMENTS

| | | |
|---|---|---|
| CN | 202354012 U | 7/2012 |
| CN | 217279497 U | 8/2022 |

(Continued)

OTHER PUBLICATIONS

Search Report dated Jan. 2, 2024 issued by Taiwan Intellectual Property Office for counterpart application No. 112123671.

*Primary Examiner* — Jon T. Schermerhorn, Jr.
(74) *Attorney, Agent, or Firm* — Demian K. Jackson; Jackson IPG PLLC

(57) ABSTRACT

A heat dissipation structure includes a base provided on top and bottom surfaces with a solder dispensing opening and a plurality of receiving grooves, respectively; and a plurality of heat pipes. The solder dispensing opening is transversely extended across and communicable with a top of the receiving grooves. The heat pipes are fitted in the receiving grooves and subjected to a mechanical processing to be flush with the bottom surface of the base. A type of solder is filled into a space between the heat pipes and the receiving grooves via the solder dispensing opening. Then, the heat pipes and the base are heated in a heating furnace. After removing the heat pipes and the base from the furnace, the solder is cooled and cured to form a solder layer, which fills up the space and tightly connect the heat pipes to the base to avoid thermal resistance between them.

6 Claims, 8 Drawing Sheets

(56) References Cited

U.S. PATENT DOCUMENTS

2007/0285897 A1* 12/2007 Huang ................ F28D 15/0275
                                                  257/E23.088
2014/0150990 A1   6/2014 Huang
2021/0123687 A1*  4/2021 Lin .................... H05K 7/20336

FOREIGN PATENT DOCUMENTS

TW      200806404 A    2/2008
TW       M648554 U   11/2023

* cited by examiner

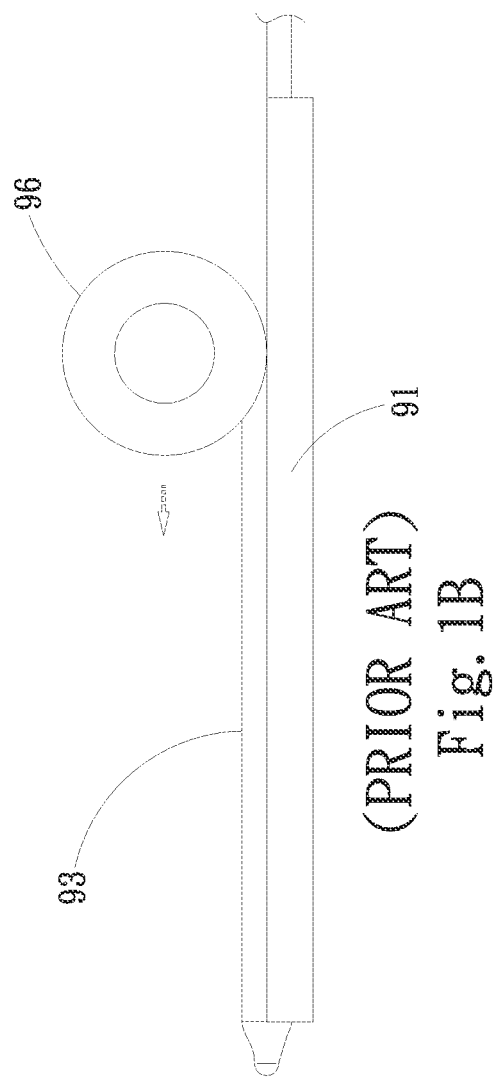
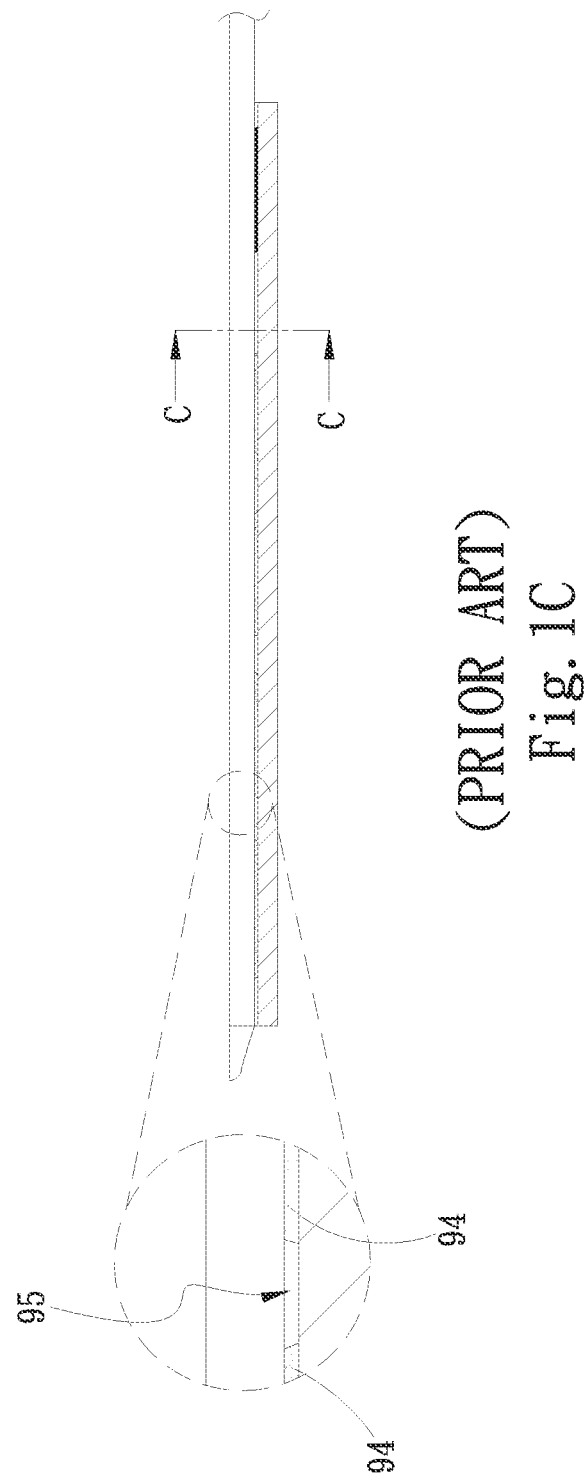
(PRIOR ART)
Fig. 1B
(PRIOR ART)
Fig. 1C

HEAT DISSIPATION STRUCTURE

FIELD OF THE INVENTION

The present invention relates to the field of heat dissipation technology, and more particularly, to a heat dissipation structure.

BACKGROUND OF THE INVENTION

In the field of heat dissipation technology, most of the commercially available thermal modules include a base 91, heat pipes 93, and a radiation fin assembly (not shown). Please refer to FIGS. 1A to 1D. In the conventional thermal module, the base 91 has a top surface 911 and a bottom surface 912. A plurality of parallelly arranged receiving grooves 92 is formed on the bottom surface 912 of the base 91. The receiving grooves 92 respectively have a semi-circularly curved cross section for receiving one heat pipe 93 therein. The heat pipes 93 respectively have a round outer surface, which is in contact with the semi-circularly curved receiving groove 92. The heat pipes 93 in the receiving grooves 92 are subjected to rolling process, so that one side of each of the round heat pipes 93 is flattened and flush with the bottom surface 912 of the base 91 for fitly contacting with a heat source. In a conventional method of assembling the base 91 and the heat pipes 93 of the thermal module, the base 91 is positioned with the receiving grooves 92 on the bottom surface 912 facing upward. Then, a type of solder 94 such as a liquid solder paste is dispensed in dots at intervals along a lowermost portion (or the recessed portion) of a semi-circularly curved inner surface 921 of each of the receiving grooves 92. Thereafter, the round-sectional heat pipes 93 are fitted in the receiving grooves 92 in one-to-one correspondence and subjected to the rolling process on a rolling machine 96. Lastly, a half-finished product, i.e. an assembly of the base 91 and the heat pipes 93, is heated in a heating furnace to complete a heat welding operation and fixedly connect the heat pipes 93 to the base 91.

In the above described conventional method of assembling the base 91 and the heat pipes 93 of the thermal module, the heat pipes 93 are initially loose-fitted in the receiving grooves 92. Therefore, a space 95 is existed between the receiving grooves 92 and the heat pipes 93 fitted therein. The space 95 tends to cause thermal resistance between the heat pipes 93 and the base 91. To solve the problems of thermal resistance caused by the space 95 and to ensure tight bonding of the heat pipes 93 to the base 91, a general way adopted by manufacturers is to coat or dispense dots of a solder paste on the inner surface 921 of each of the receiving grooves 92 before the heat pipes 93 are fitted in the receiving grooves 92. The heat pipes 93 are then compressed and partially deformed in the rolling process to be forced into the receiving grooves 92; and one side of each of the heat pipes 93 exposed from the receiving grooves 92 is flattened to be flush with the bottom surface 912 of the base 91. Lastly, the preliminarily assembled heat pipes 93 and base 91 are heated in the heating furnace. When the heated solder paste is cured, it firmly bonds the heat pipes 93 to the base 91.

The structure and the assembling method of the conventional thermal module are inconvenient for use and have the following disadvantages:

1. Solder or liquid solder paste mainly consists of tin powder and flux and is easily become dried and cured at normal temperature. In the conventional method of assembling the heat pipes to the base, the solder is applied before the rolling process and the heat welding operation is performed after other parts are assembled to the thermal module. The whole assembling process lasts for quite a long time and the solder often becomes dried and cured in the assembling process to lose its fluidity and fail to fill up the whole space between the heat pipes and the receiving grooves, which results in solder skip in the welding operation and reduced heat transfer efficiency of the thermal module, as shown in FIGS. 1C and 1D.
2. According to the existing thermal module technology, the size of the receiving groove and the diameter and perimeter of the heat pipe are precisely matched in advance to reduce the space existed between the receiving groove and the heat pipe and to minimize the amount of solder to be consumed. When the heat pipes are fitted into the receiving grooves after the fluid solder is applied in the receiving grooves, the heat pipes would push the solder to flow and spread in the space. However, it is unable to control the flowing direction of the solder, which leads to uneven distribution of the solder in the space between the heat pipes and the receiving grooves before the welding operation is performed and results in the problem of solder skip during the welding operation.
3. Since the solder is added to the receiving grooves in dots before the heat pipes are fitted in the receiving grooves and subjected to the rolling process, the solder often becomes dried and cured before the rolling process. The dried and cured solder would cause deformed outer walls of the heat pipes in the course of bonding the heat pipes to the receiving grooves via rolling. The outer walls of the heat pipes are radially inward collapsed to reduce internal spaces of the heat pipes for holding gas. In some worse conditions, the outer walls of the heat pipes are broken or damaged under the pressure applied thereto to result in reduced overall heat transfer efficiency or abnormality of the heat pipes.

It is therefore tried by the inventor to develop an improved heat dissipation structure to overcome the problems in the structure and the assembling method of the conventional thermal module.

SUMMARY OF THE INVENTION

It is a primary object of the present invention to overcome the above problems in the conventional thermal module by providing an improved heat dissipation structure, which eliminates the disadvantages that the solder could not fully fill the space existed between the heat pipes and the receiving grooves, the quickly cured and evenly distributed solder tends to cause solder skip, and thermal resistance would occur between the heat pipes and the base due to solder skip.

The heat dissipation structure according to the present invention includes a base and a plurality of heat pipes. The base has a bottom surface and a top surface. The bottom surface of the base is provided with a plurality of receiving grooves for receiving the heat pipes therein; and the top surface of the base is provided with at least one solder dispensing opening, which is transversely extended across and communicable with the receiving grooves. And, a solder layer is formed in a space existed between the base and the heat pipes.

Since the solder dispensing opening on the top surface of the base is communicable with the receiving grooves, the heat pipes fitted in the receiving grooves can be subjected to a rolling process before a type of solder is dispensed via the solder dispensing opening into the space existed between the heat pipes and the receiving grooves on the base. In this way, the solder can quickly and evenly fill up the space due to the gravity and a capillary action occurred in the space. That is, the solder would not cure in the rolling process to cause deformed heat pipe outer walls or be pressed out of the space. The solder can fully fill up the whole space between the heat pipes and the receiving grooves to minimize solder skip and maintain good heat pipe features.

BRIEF DESCRIPTION OF THE DRAWINGS

The structure and the technical means adopted by the present invention to achieve the above and other objects can be best understood by referring to the following detailed description of the preferred embodiment and the accompanying drawings, wherein

FIG. 1B is a schematic side view showing the heat pipes assembled to the base shown in FIG. 1A are further subjected to a rolling process according to the conventional assembling method;

FIG. 1C is an assembled sectional view showing the heat pipes and the base of FIG. 1A after they are assembled according to the conventional assembling method;

DETAILED DESCRIPTION OF THE PREFERRED EMBODIMENTS

The present invention will now be described with a preferred embodiment thereof.

Figure 1A:
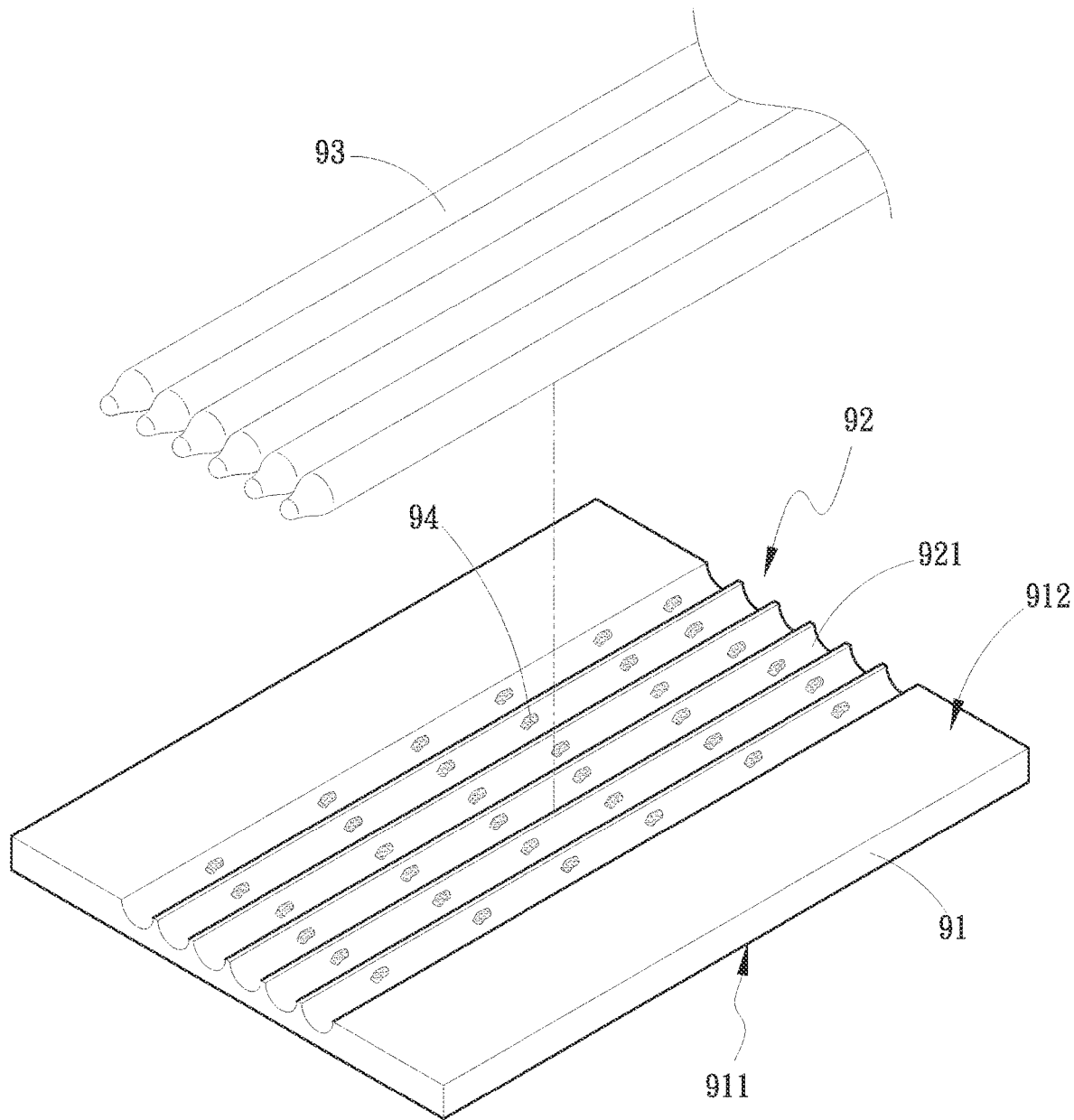
FIG. 1A is an exploded perspective view showing a conventional method of assembling a plurality of heat pipes to a base of a thermal module.
Figure 1D:
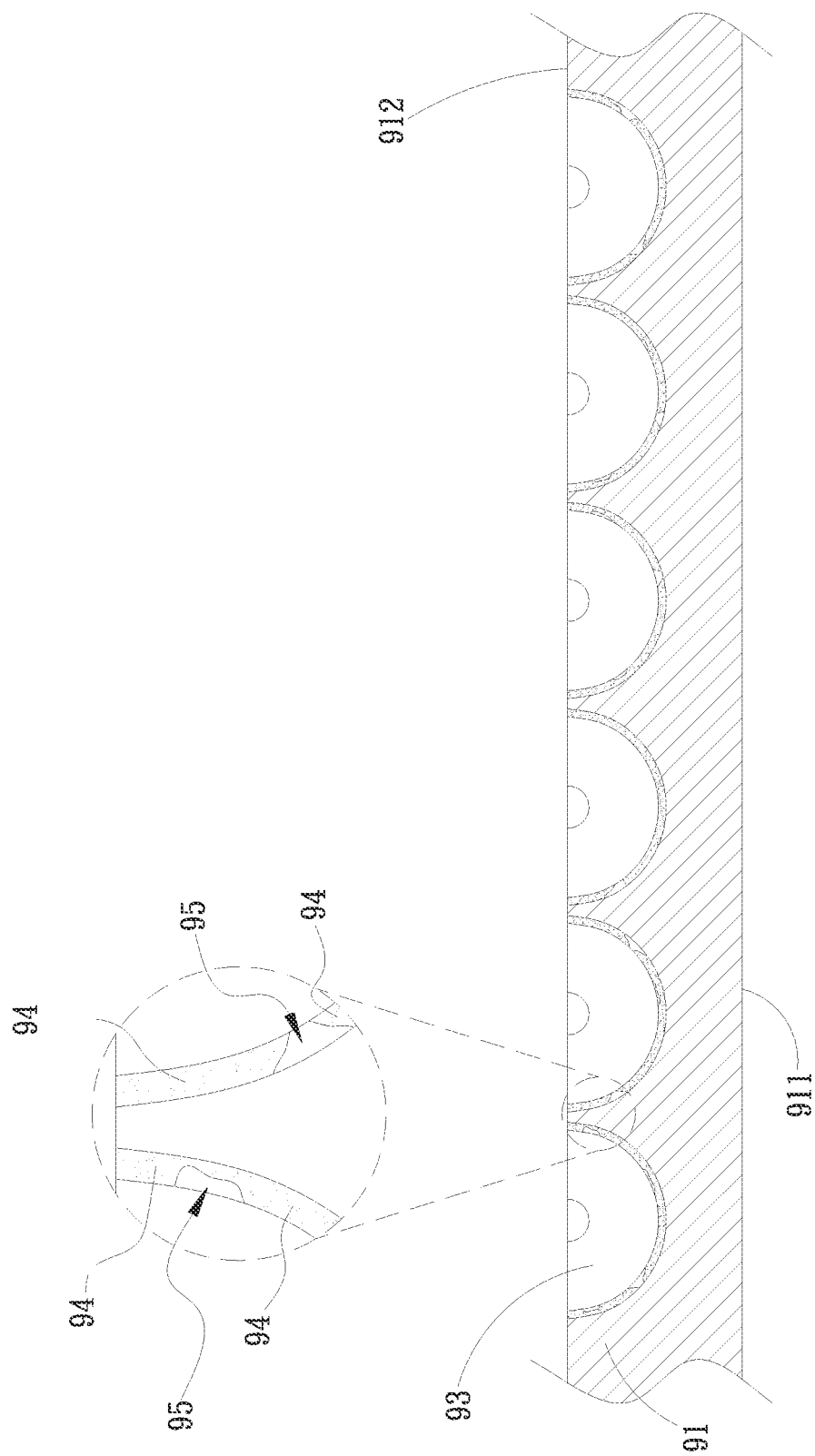
FIG. 1D is a sectional view taken along line C-C of FIG. 1C.
Figure 2A:
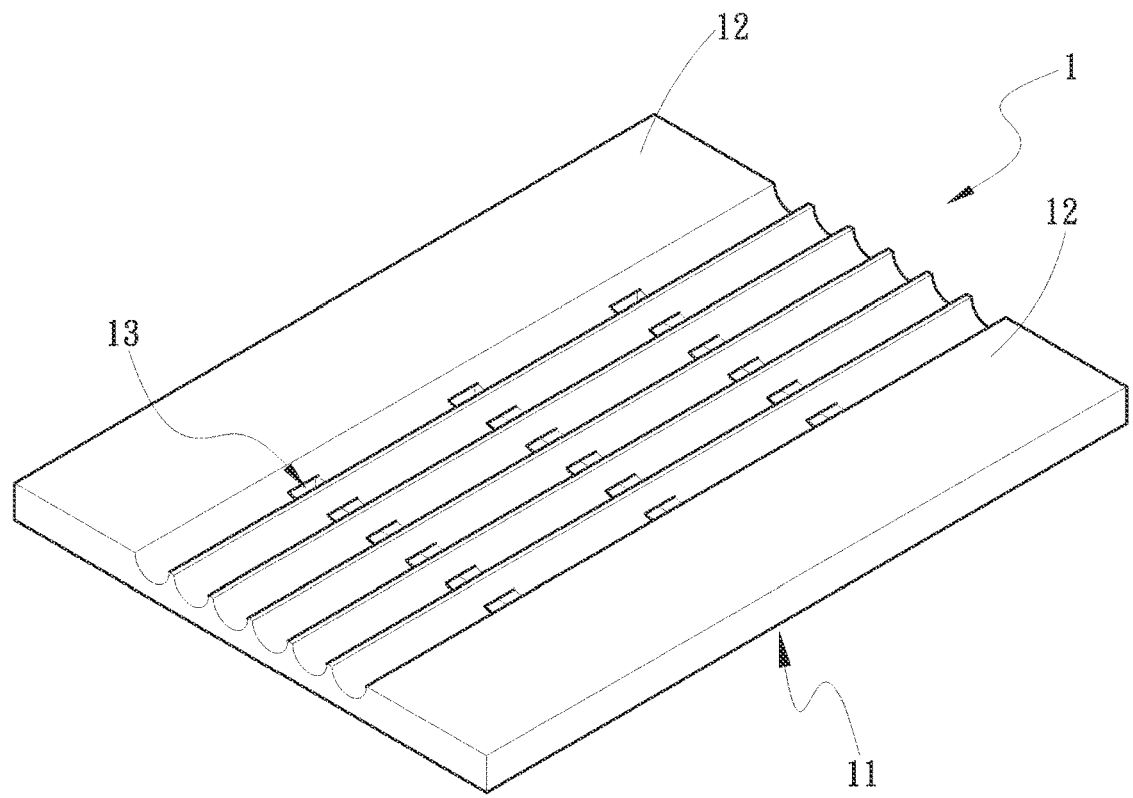
FIG. 2A is a perspective bottom view of a base for a heat dissipation structure according to a preferred embodiment of the present invention.
Figure 2B:
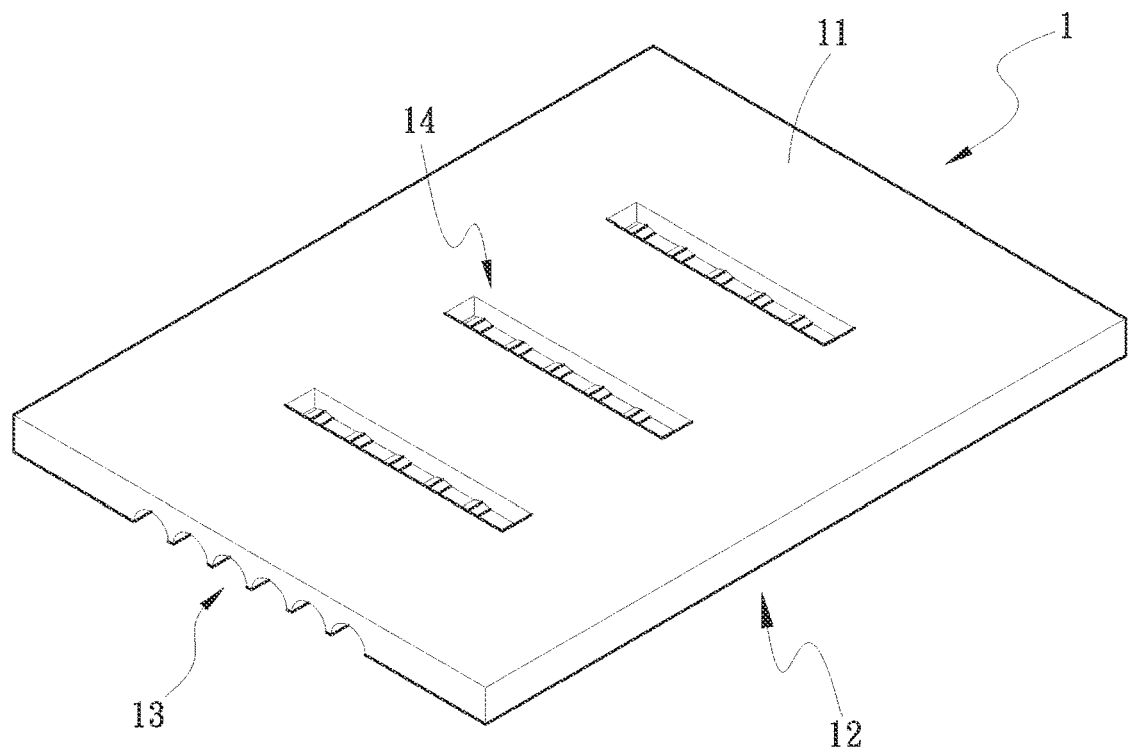
FIG. 2B is a perspective top view of the base for the heat dissipation structure according to the preferred embodiment of the present invention.
Figure 2C:
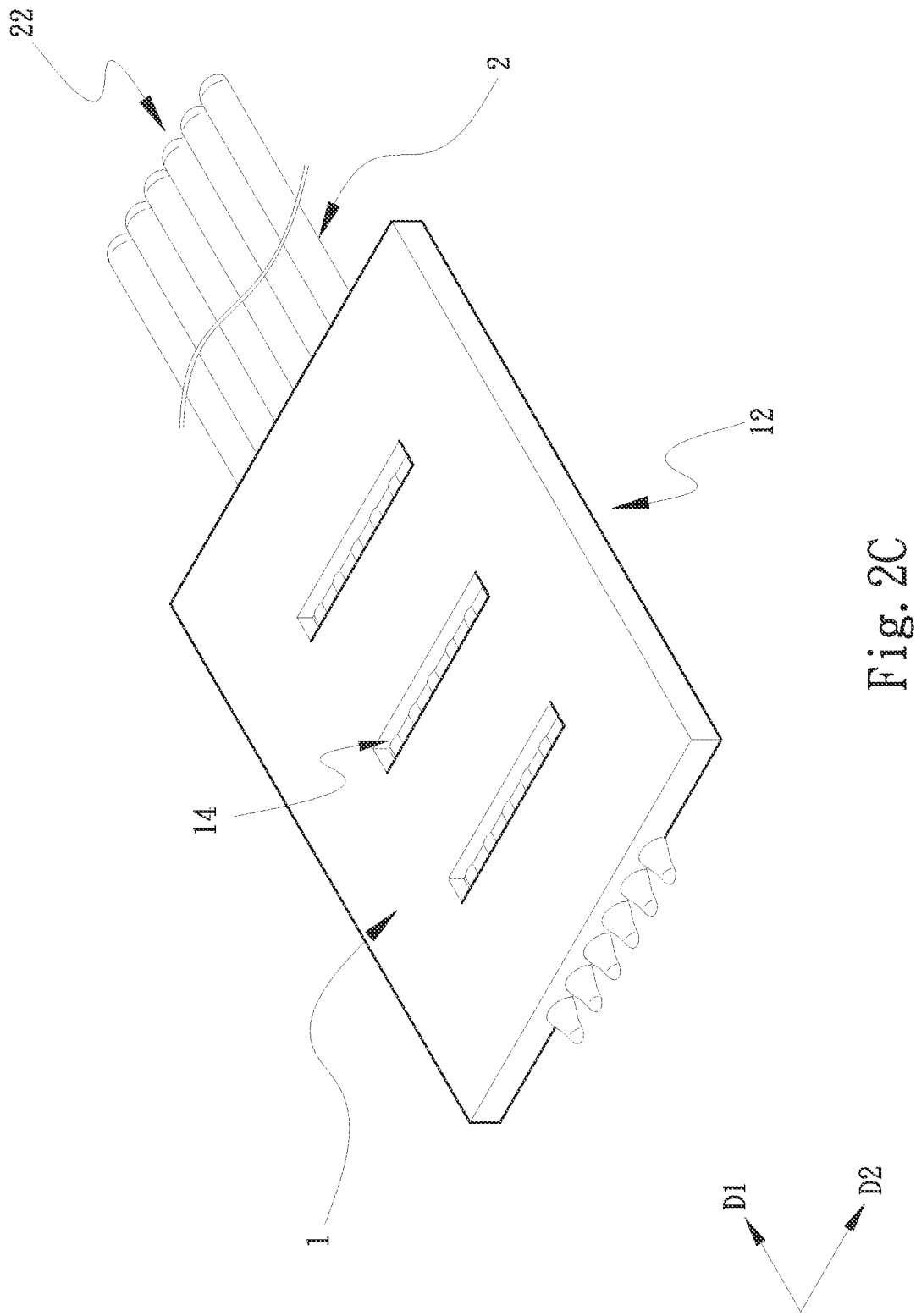
FIG. 2C is an assembled top perspective view of the heat dissipation structure according to the preferred embodiment of the present invention.
Figure 2D:
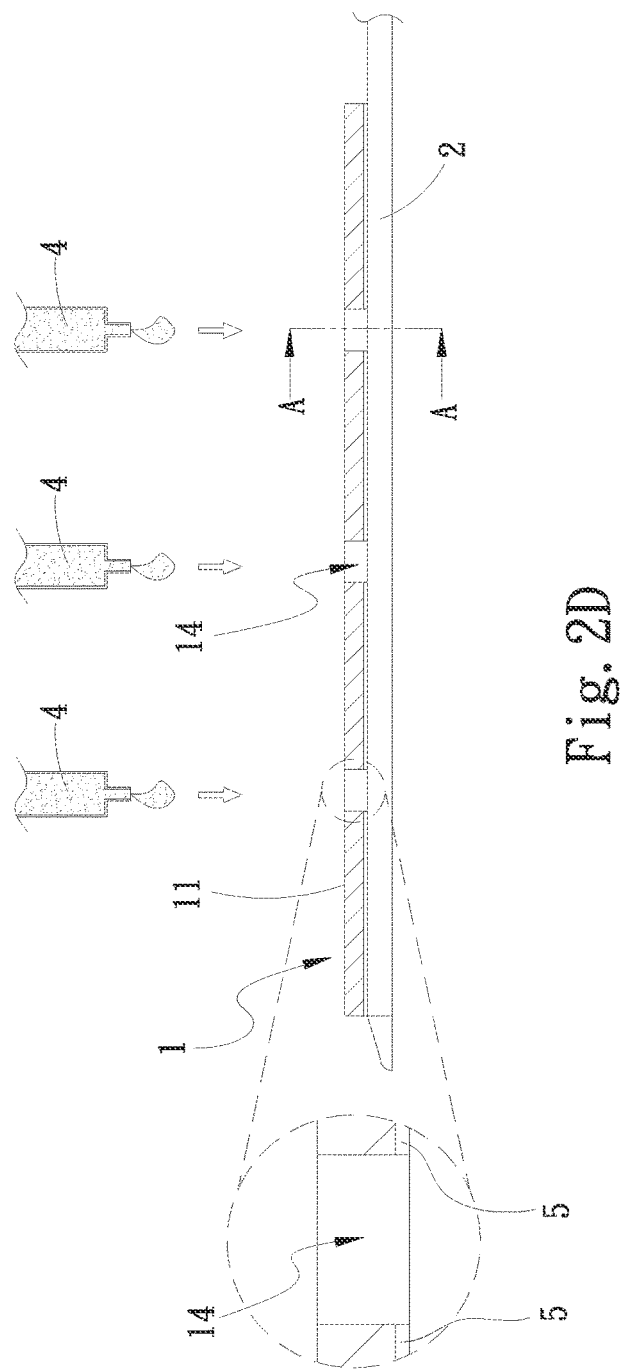
FIG. 2D is an assembled side view of the heat dissipation structure of FIG. 2C before a solder is dispensed to between the base and a plurality of heat pipes of the heat dissipation structure.
Figure 2E:
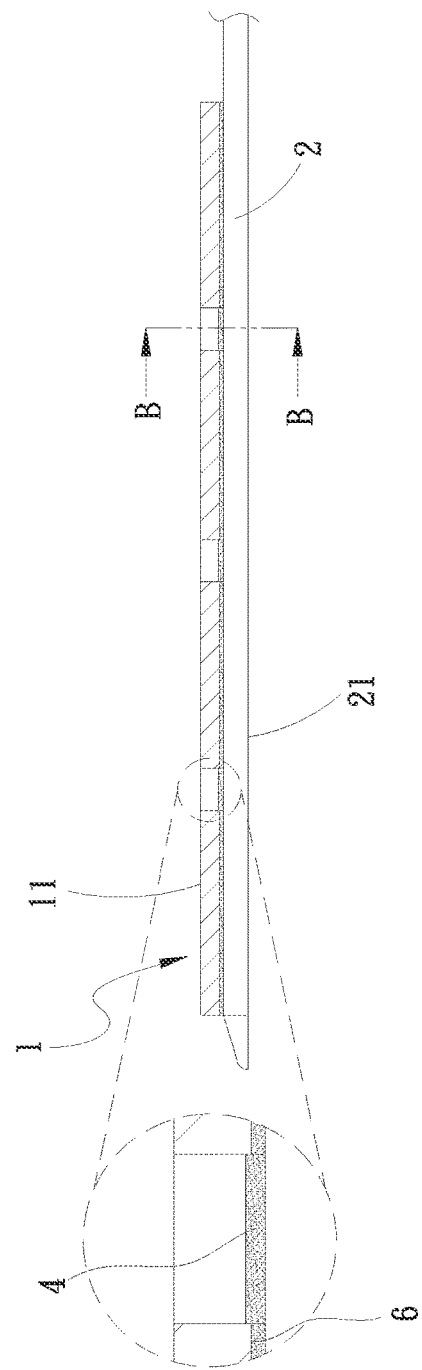
FIG. 2E is an assembled side view of the heat dissipation structure of FIG. 2C after the solder is dispensed to between the base and the heat pipes.
Figure 2F:
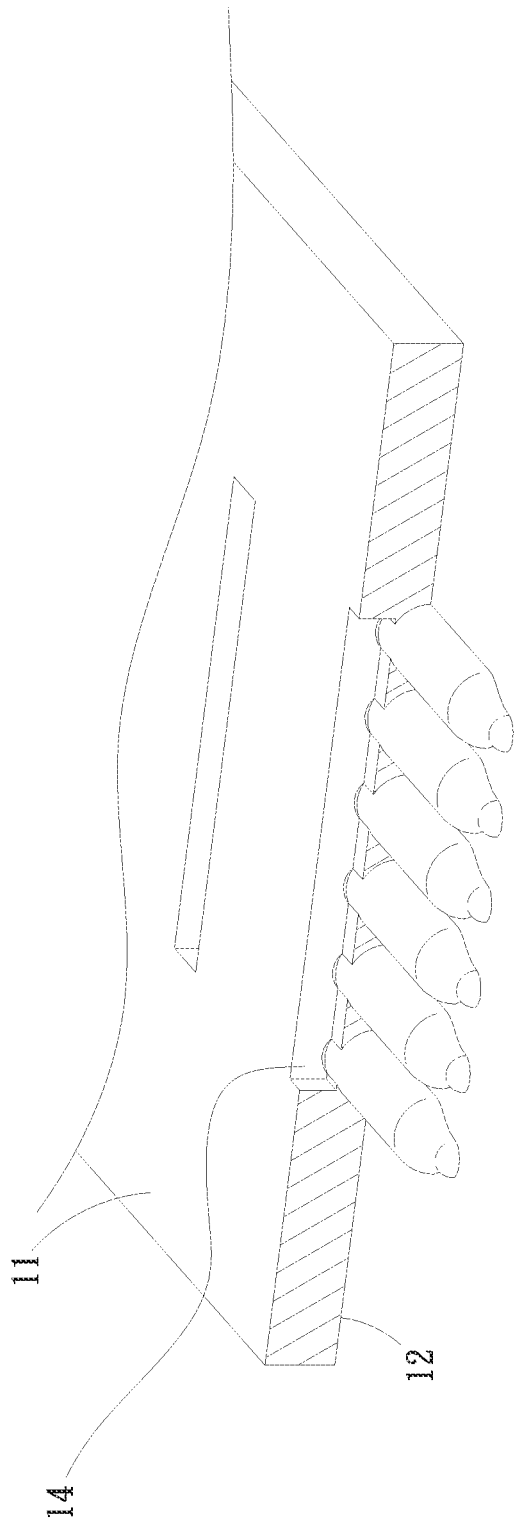
FIG. 2F is a perspective sectional view taken along line A-A of FIG. 2D before the solder is dispensed to between the heat pipes and the base.
Figure 2G:
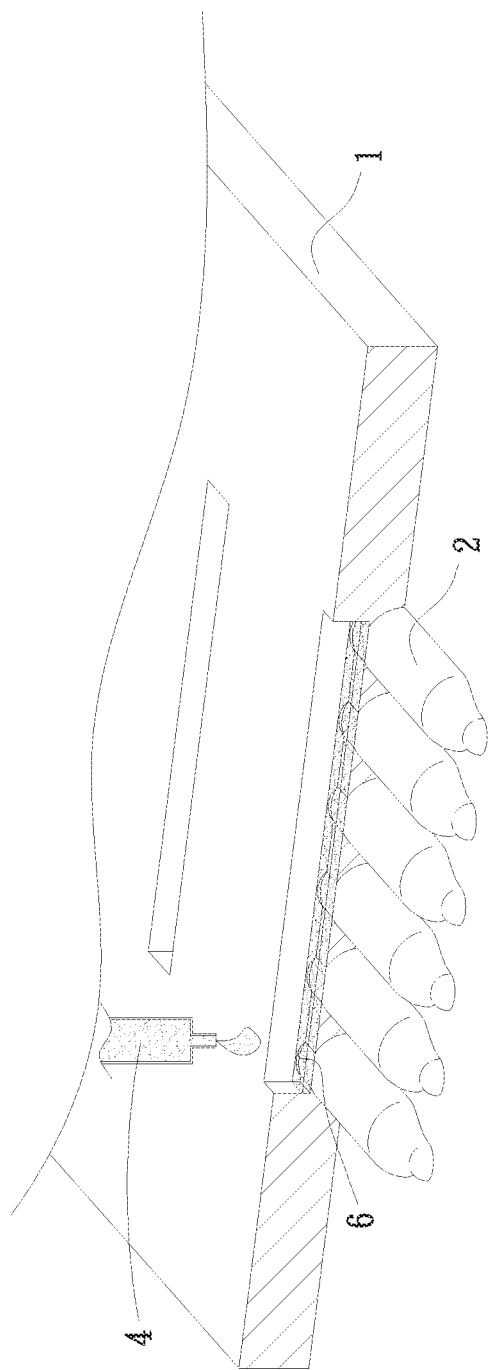
FIG. 2G is a perspective sectional view taken along line B-B of FIG. 2E after the filled solder is cured between the heat pipes and the base.

Please refer to FIGS. 2A and 2B, which are bottom and top perspective views, respectively, of a base 1 for a heat dissipation structure according to a preferred embodiment of the present invention; to FIG. 2C, which is an assembled top perspective view of the heat dissipation structure according to the preferred embodiment of the present invention; to FIGS. 2D and 2E, which are side views of the heat dissipation structure according to the preferred embodiment of the present invention before and after a solder is dispensed into spaces between the base and a plurality of heat pipes; and to FIGS. 2F and 2G, which are sectional views taken along line A-A of FIG. 2D and line B-B of FIG. 2E, respectively. As shown, the heat dissipation structure of the present invention is featured by a structurally improved base 1, so that a thermal module formed of the entire heat dissipation structure of the present invention can be fabricated using improved method and steps.

The base 1 has a top surface 11 and a bottom surface 12. The bottom surface 12 has a plurality of receiving grooves 13 provided thereon and the top surface 11 has at least one solder dispensing opening 14 provided thereon. The solder dispensing opening 14 has a depth extended through the base 1 to communicate with the receiving grooves 13.

In the preferred embodiment, the base 1 is a rectangular cuboid defining a first direction D1 and a second direction D2. The first direction D1 intersects with and is perpendicular to the second direction D2.

The receiving grooves 13 are sunken from the bottom surface 12 toward the top surface 11 and are longitudinally extended in the first direction D1. The solder dispensing opening 14 is sunken from the top surface 11 toward the bottom surface 12 and transversely extended in the second direction D2. Since the first direction D1 is perpendicular to the second direction D2, the solder dispensing opening 14 is transversely extended across a top of the receiving grooves 13 and is communicable with the receiving grooves 13.

The heat dissipation structure further includes a plurality of heat pipes 2, each of which includes a vaporizing section 21 and a condensing section 22. The vaporizing sections 21 are correspondingly located in the receiving grooves 13, and the condensing sections 22 are connected to a radiation fin assembly (not shown).

As can be seen in FIGS. 2D to 2G, the heat pipes 2 are loose-fitted in the receiving grooves 13 on the base 1. Portions of the heat pipes 2 in contact with the receiving grooves 13 are subjected to a mechanical processing, such as rolling, such that the heat pipes 2 originally having a round cross section are forced into the receiving grooves 13 with one side of the heat pipes 2 that has the pressure applied thereto is flattened to be flush with the bottom surface 12 of the base 1. Then, a type of solder 4 such as a liquid solder paste is filled into a space 5 between the heat pipes 2 and the receiving grooves 13 on the base 1 (see FIGS. 2D and 2F) via the solder dispensing opening 14 on the base 1. The solder 4 quickly and evenly spreads in the space 5 under a capillary action occurred in the space 5 to finally fill up the space 5. The base 1 and the heat pipes 2 are then placed in a heating furnace (not shown) and heated. After the heating process, the base 1 and the heat pipes 2 are removed from the heating furnace and cooled. The cooled solder 4 forms a solder layer 6 in the space 5 between the heat pipes 2 and the receiving grooves 13 on the base 1. The solder layer 6 enables a tighter bonding between the heat pipes 2 and the base 1 and fully fills the space 5 between the heat pipes 2 and the base 1 to avoid the occurrence of thermal resistance at the space 5.

In the present invention, the base 1 is structurally changed by the solder dispensing opening 14 provided on the top surface 11 of the base 1, such that the heat pipes 2 can be fitted in the receiving grooves 13 on the base 1 and subjected to the rolling process before the solder 4 is dispensed via the solder dispensing opening 14 into the space 5 between the heat pipes 2 and the receiving grooves 13. In this manner, the heat pipes 2 subjected to the rolling process can be more tightly bonded to the receiving grooves 13 and the solder 4 can be quickly and evenly filled in the whole space 5 thanks to the gravity and a capillary action occurred in the space 5.

Therefore, the problems in the method of assembling the heat pipes 93 and the base 91 of the conventional thermal module, such as uneven distribution of the solder 94 in the space 95 between the heat pipes 93 and the receiving grooves 92, solder skip, deformed heat pipes 93, etc., can be overcome.

In brief, the present invention has the following advantages:

1. Simplifying heat dissipation module assembling procedures;
2. Avoiding solder skip and minimizing thermal resistance; and
3. Preventing the heat pipes in the receiving grooves from deformation during the rolling process due to cured solder.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A heat dissipation structure, comprising:
    a base having a bottom surface and a top surface, the bottom surface having at least one receiving groove provided thereon and the top surface having at least one solder dispensing opening provided thereon, and the solder dispensing opening being transversely extended across and communicable with a top of the receiving groove;
    a plurality of heat pipes being fitted in the at least one receiving groove on the base; and
    a solder layer being formed between the heat pipes and the at least one receiving groove.

2. The heat dissipation structure as claimed in claim 1, wherein the base having one edge extended in a first direction and another edge extended in a second direction, and the first direction intersecting with or being perpendicular to the second direction.

3. The heat dissipation structure as claimed in claim 2, wherein the at least one receiving groove is longitudinally extended in the first direction of the base and the at least one solder dispensing opening is transversely extended in the second direction of the base.

4. The heat dissipation structure as claimed in claim 1, wherein the heat pipes respectively has a vaporizing section and a condensing section located at two opposite ends of the heat pipe; and the vaporizing sections of the heat pipes being fitted in the at least one receiving groove on the base.

5. The heat dissipation structure as claimed in claim 4, wherein the condensing sections of the heat pipes are connected to a radiation fin assembly.

6. The heat dissipation structure as claimed in claim 1, wherein each of the heat pipes and the at least one receiving groove have a space existed between them, and the solder layer being formed in the space and connecting the heat pipes to the at least one receiving groove.

* * * * *